March 14, 1967 E. K. C. YU ETAL 3,309,534
BISTABLE FLIP-FLOP EMPLOYING INSULATED GATE
FIELD EFFECT TRANSISTORS
Filed July 22, 1964

INVENTORS
EDWIN K. C. YU
ADOLPH K. RAPP
BY
Henry Hansen
W. C. Everett
ATTORNEYS

United States Patent Office 3,309,534

Patented Mar. 14, 1967

3,309,534

BISTABLE FLIP-FLOP EMPLOYING INSULATED GATE FIELD EFFECT TRANSISTORS

Edwin K. C. Yu, Manville, and Adolph K. Rapp, Princeton, N.J., assignors, by mesne assignments, to the United States of America as represented by the Secretary of the Navy Filed July 22, 1964, Ser. No. 384,563
1 Claim. (Cl. 307—88.5)

The present invention relates to bistable storage elements and more particularly to transistorized flip-flops.

In the field of bistable storage elements or flip-flops used in computer technology and the like it has been the practice to employ a pair of transistors in a back-to-back arrangement in which one of the terminal elements of one of the transistors is linked through a parallel RC coupling to the base of the other transistor and vice versa. The same terminal element of each transistor is then linked through a load impedance to a voltage source. The flip-flops so constructed have the characteristics that when one transistor is conduiting, the other transistor is subsanially a cutoff. The flip-flop can be reversed, i.e., the one which is conducting can be caused to cut off and the one which is cut off can be caused to conduct by insertion of a pulse at certain poistions in the flip-flop. The flip-flop can also be set to a certain position for information storage purposes. Prior art devices have had the difficulty that they draw a considerable amount of current and/or take an appreciable switching time. This has the drawback that if the switching pulse is very short, the flip-flop may not switch over, because the pulse has gone before the flip-flap is on its way to switching. The present invention provides a bistable flip-flop storage element which uses a very low standby current drain and uses a very short switching time. To attain this, the present invention contemplates a flip-flop consructed solely of eight insulated gate field effect transistors. Two of the transistors are cross linked from a terminal point of one to the gate of the other in the usual manner. Two more are substituted for the two load resistances on the two sides and the other four in pairs of two are connected in parallel with each of the first two transistors to control their operation. Because of the use of insulated gate transistors the need for the RC coupling in the cross linkages and other resistances and capacitances in the network is completely eliminated. The use of a transistor in place of each load resistance provides a very high impedance during standby conditions and a very high current during switching conditions so as to attain the new position with greater speed for the same power level.

Accordingly, it is an object of the present invention to provide a bistable storage element in which transistors are substituted for the load resistor to provide much faster switching time.

Another object of the invention is to provide a bistable storage element in which insulated gate transistors are used to eliminate the necessity of resistances and capacitances in the circuit.

A further object of the invention is the provision of a bistable storage element using transistors in parallel with the control transistors to provide firmer and quicker switching.

With these and other objects in view as will hereinafter more fully appear and which will be more particularly pointed out in the appended claim, reference is now made to the following description taken in connection with the accompanying drawings in which:

Figure 1:
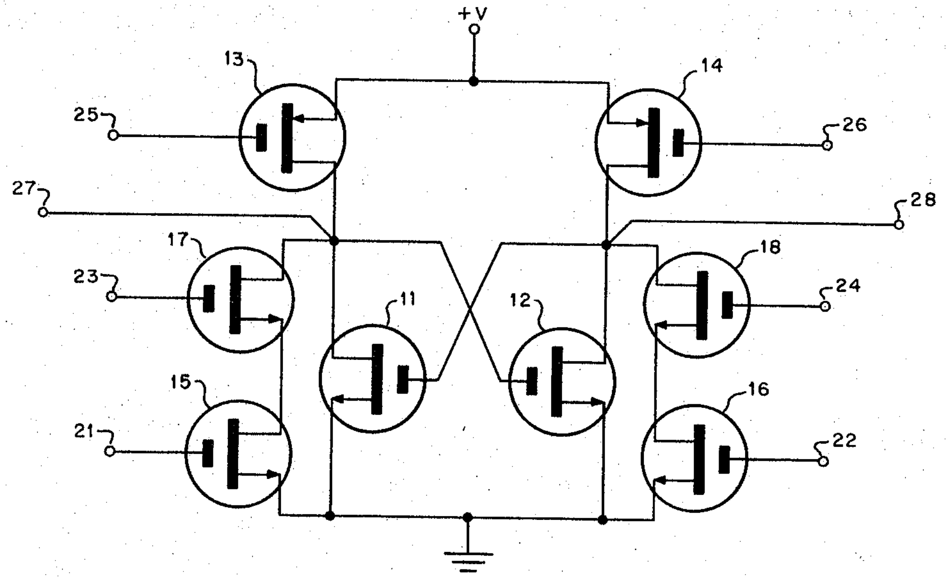
FIG. 1 shows a circuit diagram of a bistable storage element according to the present invention.

Referring now to FIG. 1, there are shown a pair of control transistors 11 and 12 in the customary position in a bistable flip-flop circuit. Transistors 11 and 12 control the operation of the flip-flop in that when 11 is conducting, 12 is not and vice versa. When transistor 11 or 12 is conducting, the voltage across it is low and when it is not conducting the voltage across it is high. Each of transistors 11 and 12 has an emitter, collector, and gate. The collector of each is connected to the gate of the other. In place of the usual load resistances a pair of load transistors 13 and 14 are provided. These transistors are connected so as to have a very high impedance in the standby state and a very low impedance in the switching state. In parallel with each control transistor 11, 12 there are provided two pairs of transistors, a pair of signal transistors 15, 16 and a pair of switching transistors 17, 18. Transistors 17 and 18 are connected so as to have a high impedance in the standby state and a very low impedance in the switching state. Signal transistors 15 and 16 are connected to have a high or low impedance to determine the state of the flip-flop after switching, as will be more fully explained below.

Each of the transistors 11 through 18 will preferably be of the insulated gate type. A particular advantageous type of insulated gate thin film transistor is disclosed by Harold Borkan and Paul Weimer in the RCA Review, June 1963, pages 153 to 165. These transistors, which are made in the form of an extremely thin film, use cadmium sulphide as the semi-conductor and have a control electrode insulated from the semi-conductor. This type of transistor is a field effect transistor, which is to say that the conduction of current in the transistor is controlled by the voltage at the gate rather than by the current through the base of the transistor as is ordinarily the case. These transistors are more fully disclosed in the aforesaid article by Borkan and Weimer. These transistors are also unipolar in the sense that they have majority carriers only, and are preferably of the enhancecent type in which there is substantially no current conducted through the transistor when the gate-to-emitter voltage is almost zero. Regardless of the conduction of current through the transistor, the gate of the transistor draws almost no current, inasmuch as a typical input resistance at the gate is $10^{15}$ ohms or more. By virtue of the fact that the gates of transistors 11 and 12 are insulated from the transistor and draw no current, the usual parallel RC coupling in the cross linkage of the usual flip-flop may be completely eliminated, and the gates of transistors 11 and 12 are each grounded to the collector of the other. As used here, grounded means the connection is of substantially zero impedance. The transistors have an emitter and a collector with the direction of the arrow at the emitter indicating the direction of current through the transistor. In unipolar transistors, the emitter is also called the source, and the collector is called the drain. In referring to the transistors hereafter, a pair of common ends in referring to a pair of transistors will refer to either both collectors or both emitters of that pair.

The operation of the storage element is controlled by a set of signals inserted at the gates at points 21 through 26. In the standby state, the voltages at points 23 and 24 are low to hold transistors 17 and 18 in the nonconducting state. The voltages at points 25 and 26 are high in order to hold transistors 13 and 14 in the nonconducting state. The voltages on points 21 and 22 are immaterial except during the switching state, when they will control the operation of the flip-flop storage element. The operation of the flip-flop is as follows. The voltages at 21 and 22 are the complementary gating levels which determine the state of the flip-flop after switching. Assume that 21 is high to turn on transistor 15 and 22 is low to turn off transistor 16. At switching, negative pulses are inserted at 25 and 26 to make transistors 13 and 14 conducting, and positive pulses are inserted at 23 and 24 to make transistors 17 and 18 conducting. When transistors 17 and 18 are made conducting, the voltages at point 27 and 28 will be lowered. However, since transistor 16 is still nonconducting, the voltage at point 28 will be much higher than the voltage at point 27. Correspondingly, transistor 11 will be turned on to a much greater extent than transistor 12 because the voltage level on its gate is much higher. When the switching pulses are turned off, the voltage level on point 28 will be quite high, making transistor 11 highly conductive, and conversely the voltage at point 27 will be quite low, making transistor 12 substantially nonconductive. This is a stable condition which will remain until new switching pulses are inserted. Because transistors 13 and 14 are made conductive by the switching pulses at 25 and 26, a high rate of current will flow very briefly and the flip-flop will attain its position very quickly. Switching times for the flip-flop may be attained as low as 10 nano-seconds. Once the flip-flop has attained its position after switching, it does not matter whether the levels on points 21 and 22 remain the same. Whether they do or not depends on the particular circuit in which the flip-flop element is used. Points 27 and 28 provide the outputs to the circuit from the flip-flop.

Figure 2:
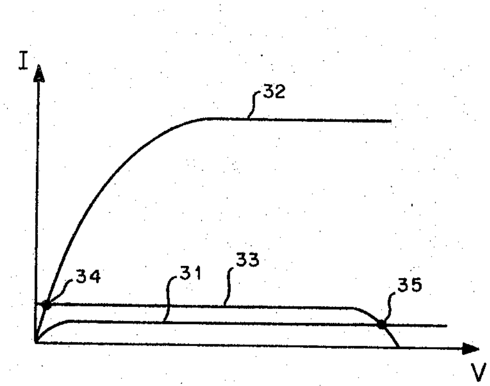
FIG. 2 shows the characteristics during standby of the transistors in the circuit of FIG. 1.
Figure 3:
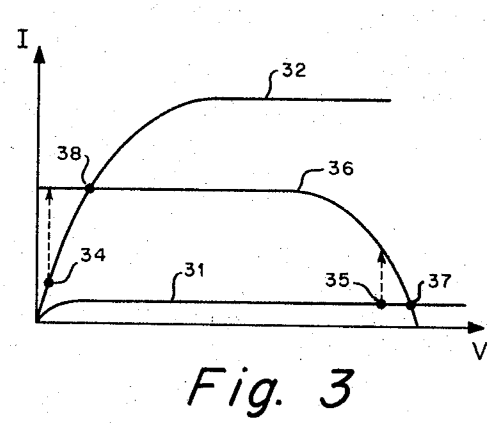
FIG. 3 shows the characteristics during switching of the transistors in the circuit of FIG. 1.

FIGURES 2 and 3 show the detailed operation by reference to the voltage-current relationships in the flip-flop. In FIG. 2, line 31 shows the characteristic of the control transistors 11 or 12 in the nonconducting state. Line 32 shows the characteristic of the control transistors 11, 12 in the conducting state. Line 33 shows the characteristic load line presented to transistors 11 or 12 by load transistors 13 or 14 when the load transistors are in the nonconducting or off state. It will immediately be noted that this load line unlike the load lines of ordinary resistances is not a straight line, due to the nonlinear voltage-current relationship of transistors 13 and 14. Load line 33 intersects the conducting transistor line 32 at point 34, which is at a very low voltage as would be expected. However, load line 33 intersects the characteristic line 31 of the transistor which is off at point 35, which is a very high voltage, much higher than would be expected with a constant resistance. This increased difference in voltage between the on state and off state provides a much sharper delineation of the two states in the operation of the flip-flop element. In FIG. 3 the same characteristic lines of transistors 11 and 12 are shown with the load line 36 presented by load transistors 13 and 14 when they are in the conducting or on state. Load line 36 intersects characteristic line 31 at point 37, which is approximately the same current as point 35 but a slightly higher voltage, and intersects characteristic line 32 at point 38, which is a substantially higher current than point 34. Let it be assumed that before switching, transistor 11 is on and transistor 12 is off. Let it also be assumed that the gating signals are going to reverse the condition of the two transistors. Before switching, line 31 will be the characteristic line of transistor 12 with the intersection at point 35 denoting the condition of the transistor 12, and transistor 11 has the characteristic line 32 with its characteristic point 34. Upon the switching and gating pulses being applied, the load line will rise to the level of line 36. The condition of transistor 12 will rise along the dotted line and cross over on line 36 to point 38 at the intersection with characteristic line 32. The condition of transistor 11 will rise to the new load line and cross over to point 37, the intersection with characteristic line 31. When the switching pulses are removed, the condition of transistor 12, which is now on, will drop from point 38 to point 34. The condition of transistor 11 will drop in voltage from point 37 to point 35. Transistor 11 will now be off and transistor 12 will be on. As indicated, the voltage at point 28 will be the voltage indicated on the diagram for point 34, which is very low. The voltage at point 27 will be at the voltage indicated for point 35 which is very high. The level of current in both transistors throughout the switching is very high compared with a constant resistance, and the new conditions are attained in a very much shorter time than with a constant resistance at the same power level.

It will be evident from FIGS. 2 and 3 that the characteristics of the load transistors 13, 14 must be selected to insure flip-flop bistability. The maximum current for the load transistors in the on state must be less than the maximum current for the control transistors, and the leakage current for the load transistors in the off state must be more than the leakage current for the control transistors. As shown in FIGS. 2 and 3, this will cause intersection of the lines at points 34, 35, 37, and 38.

It will be noted that the standby current required by the device is extremely low as the gates 21 through 26 require substantially no current whatsoever, and the current through the load transistors 13 and 14 from the voltage source is very low because the impedance of transistors 13 and 14 in the off state is very high, in the order of megohms. Current is drawn only for the duration of the switching pulses, which are generally extremely short, generally shorter than the switching time of heretofore known flip-flop elements, at the same power level.

Various changes may be made in the elements used in the flip-flop element. For example, although load transistors 13 and 14 are shown as the P type, N type transistors may be used instead, provided only that they are maintained at a low level to cut them off, and that a positive pulse be used to turn them on. Also, of course, the other transistors which are shown as N type elements may be P type elements instead. A negative voltage source may be used instead of a positive voltage source provided that the polarity of all of the elements shown is reversed accordingly. Although cadmium sulphide is used as a semiconductor in a typical device, it will be understood that numerous other semiconductor materials are suitable such as silicon, cadmium selenide, or others. The use of transistors, either insulated gate or otherwise, in place of the load elements in flip-flop elements of the known type will also produce improved switching time. Use of insulated gate transistors in flip-flop elements of known type will allow for elimination of the RC parallel couplings.

Obviously, many modifications and variations of the present invention are possible in the light of the above teachings. It is therefore to be understood that within the scope of the appended claim the invention may be practiced otherwise than as specifically described.

What is claimed is:

A bistable flip-flop storage element comprising:

first and second output terminals;

first and second switching pulse input terminals;

first and second load transistors each having a gate, a drain, and a source, said transistors each being an insulated gate, field effect device of a first conductivity type having a maximum current characteristic and a leakage current characteristic, said sources thereof being directly connectable in parallel to a bias potential source, said drains thereof each being directly connected to a respective one of said first and second output terminals, and said gates thereof each being directly connected to a respective one of said first and second input terminals;

first and second control transistors each having a gate, a drain and a source, said transistors each being an insulated gate, field effect device of a second conductivity type having a maximum current characteristic less than that of said load transistors and a leakage current characteristic less than of said load transistors, said drains of said control transistors each being directly connected to a respective one of said first and second output terminals, said gates of said control transistors each being directly connected to a respective other of said first and second output terminals and said sources of said control transistors being directly connectable in parallel with a reference potential source;

third and fourth switching pulse input terminals;

first and second state signal input terminals;

fifth and sixth transistors each having a gate, a drain and a source, said transistors each being an insulated gate, field effect device of said second conductivity type, said drain of one of said transistors being connected to said source of the other of said transistors, said drain of said other transistor being directly connected to one of said first and second output terminals, said gate of one of said transistors being directly connected to one of said third and fourth switching pulse input terminals, and said gate of the other of said transistors being directly connected to one of said first and second state signal input terminals;

seventh and eighth transistors each having a gate, a drain and a source, said transistors each being an insulated gate, field effect device of said second conductivity type, said drain of one of said transistors being connected to said source of the other of said transistors, said drain of said other transistor being directly connected to the other of said first and second output terminals, said gate of one of said transistors being directly connected to the other of said third and fourth switching pulse input terminals, and said gate of the other of said transistors being directly connected to the other of said first and second state signal input terminals; and said sources of said one of said fifth and sixth transistors and said one of said seventh and eighth transistors being directly connectable in parallel with the reference potential source.

References Cited by the Examiner

UNITED STATES PATENTS

| | | | |
|---|---|---|---|
| 2,924,725 | 2/1960 | Blair | 307—88.5 |
| 3,134,912 | 5/1964 | Evans | 307—88.5 |
| 3,191,061 | 6/1965 | Weimer | 307—88.5 |
| 3,252,011 | 5/1966 | Zuk | 307—88.5 |

ARTHUR GAUSS, *Primary Examiner.*

J. JORDAN, *Assistant Examiner.*